US006762641B1

(12) United States Patent
Schmidt

(10) Patent No.: US 6,762,641 B1
(45) Date of Patent: Jul. 13, 2004

(54) VOLTAGE LEVEL TRANSLATION CIRCUITS

(75) Inventor: Robert Warren Schmidt, Carmel, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 119 days.

(21) Appl. No.: 09/661,506

(22) Filed: Sep. 13, 2000

Related U.S. Application Data

(60) Provisional application No. 60/174,695, filed on Jan. 6, 2000.

(51) Int. Cl.[7] .............................. G06G 7/12; G06G 2/26
(52) U.S. Cl. .......................... 327/561; 327/563; 381/28
(58) Field of Search ................................. 327/561, 563; 330/127, 199, 268, 297; 381/26, 28, 309

(56) References Cited

U.S. PATENT DOCUMENTS

| | | | | |
|---|---|---|---|---|
| 3,818,361 A | * | 6/1974 | Gonda ......................... | 330/297 |
| 3,866,063 A | * | 2/1975 | Long ........................... | 307/230 |
| 3,919,655 A | * | 11/1975 | Crandall ...................... | 330/255 |
| 4,189,680 A | * | 2/1980 | Clark .......................... | 330/59 |
| 4,194,165 A | * | 3/1980 | Skulski ....................... | 252/255 |
| 4,321,554 A | * | 3/1982 | Quilter ........................ | 330/298 |
| 4,973,916 A | * | 11/1990 | Baik ........................... | 330/255 |
| 5,029,299 A | * | 7/1991 | Rodgers ...................... | 330/298 |
| 5,199,079 A | * | 3/1993 | Anderson et al. ............. | 381/94 |
| 5,841,879 A | * | 11/1998 | Scofield et al. ............. | 381/309 |
| 5,909,146 A | * | 6/1999 | Okada ......................... | 330/255 |

FOREIGN PATENT DOCUMENTS

| | | |
|---|---|---|
| DE | 2947663 | 7/1981 |
| WO | 95/30273 | 11/1995 |

OTHER PUBLICATIONS

Paul D. Chapman, "Build A Stereo Headphone Amplifier", 8007 Audio, vol. 67, No. 5, May 1983, pp. 62–63.
Jim Williams, Composite Amplifiers Yield High Speed and Low Offset EDN Electrical Design News, vol. 32, No. 2, Jan. 22, 1987, pp. 139–150.
Data Sheet of DM1877 Dual Audio Power Amplifier, National Semiconductor, Feb. 1995.

* cited by examiner

Primary Examiner—Terry D. Cunningham
Assistant Examiner—Quan Tra
(74) Attorney, Agent, or Firm—Joseph S. Tripoli; Joseph J. Laks; Reitseng Lin

(57) ABSTRACT

Voltage level translators are presented, inter alia, for operating an operational amplifier integrated circuit designed for operation with a single ended power supply, to operate with a split level power supply having a center tapped ground. A first polarity power supply terminal of a operational amplifier integrated circuit is coupled to a first polarity of the of the split level power supply, and a second polarity power supply terminal of the operational amplifier integrated circuit is coupled to a second polarity of the power supply, with a positive signal input terminal of the operational amplifier being coupled to a center tapped ground of the split level power supply. A second voltage level translator is presented to operate an integrated circuit having a maximum voltage rating with a power supply having a power supply voltage greater than the maximum voltage rating, wherein a first zener diode is coupled in series between a first polarity of the power supply and a first polarity terminal of the integrated circuit, and a second zener diode is coupled in series between a second polarity of the power supply and a second polarity terminal of the integrated circuit.

7 Claims, 2 Drawing Sheets

VOLTAGE LEVEL TRANSLATION CIRCUITS

CLAIM OF PRIORITY

Priority is claimed from U.S. Provisional Application No. 60/174,695 filed Jan. 6, 2000.

TECHNICAL FIELD

The present invention relates to the field of the operation of integrated circuits; and more particularly, relates to the adaptation of integrated circuits to work with power supplies having incompatible configurations and/or voltage levels. In both cases, the incompatibility is overcome by using voltage level translation.

BACKGROUND

In consumer electronics where low cost is an important engineering parameter, it is not uncommon to design using low cost parts in a manner in which the part was not designed to be used. Such a case can be where the power supply for a device has been designed for other purposes and it becomes necessary to use this seemingly incompatible power supply for providing an auxiliary feature. Such a case can be for a DVD player where the power supply is a balanced split level power supply, i.e. ±5.0 volts with a center tapped ground, and it is desirable for cost reasons to use an integrated circuit which is designed for a single ended power supply with input and output coupling capacitors, which are desirable to eliminate. Such input and output coupling capacitors represent an extra parts cost and also can take up printed circuit board space which sometimes is very limited. Moreover, if the input and output capacitors are electrolytics, they are particularly larger than other capacitors and represent an additional reliability problem which is desirable to eliminate.

Additionally, the incompatibility of power supply and integrated circuit configurations can occur in, for example, a digital circuit system, where various subsystems operate with different power and voltage requirements. Some integrated circuit protocols and systems require a supply voltage with a Vcc (the positive rail voltage) of 3.3 volts and a Vss (the lower rail voltage) of ground potential, while others may require a Vcc -to-Vss voltage of 5.0 volts or 2.9 volts.

Still further concerning incompatible voltages available from a power supply, many integrated circuits are extremely sensitive to over-voltage or overcurrent, since such overages can not only provide incorrect results (particularly if the integrated circuit is digital) but can also cause physical damage to the integrated circuit. Most processors have voltage and current ratings that may not be exceeded by even a little bit without causing severe damage to the integrated circuit. For example, it is not uncommon for microprocessors designed for operating at a power supply voltage of 3.3 volts to be damaged by application of signals in excess of a peak to peak of 3.45 volts when reading data from RAMs in which the high/low voltage differential is 5.0 volts. Therefore, closely limiting the voltage supply levels to meet specification is essential to the operation of integrated circuits.

SUMMARY OF THE INVENTION

A first embodiment of a voltage level translator is presented for operating an operational amplifier integrated circuit designed for operation with a single ended power supply, to operate with a split level power supply having tapped ground. A polarity power supply terminal of a operational amplifier integrated circuit is connected to a first polarity of the of the split level power supply, and a second polarity power supply terminal of the operational amplifier integrated circuit is connected to an second polarity of the power supply, with a signal input terminal of the operational amplifier being connected to the center tapped ground.

A second embodiment of a voltage level translator is presented to permit an integrated circuit having a predetermined maximum voltage rating to be operated with a split level power supply having a power supply voltage greater than the voltage rating, wherein a first voltage translation zener diode is coupled in series between a first polarity of the power supply and an appropriate first polarity terminal of the integrated circuit, and a second voltage translation zener diode is coupled in series between a second polarity of the power supply and an second polarity terminal of the integrated circuit,

DESCRIPTION OF THE PREFERRED EMBODIMENT(S)

Figure 1:
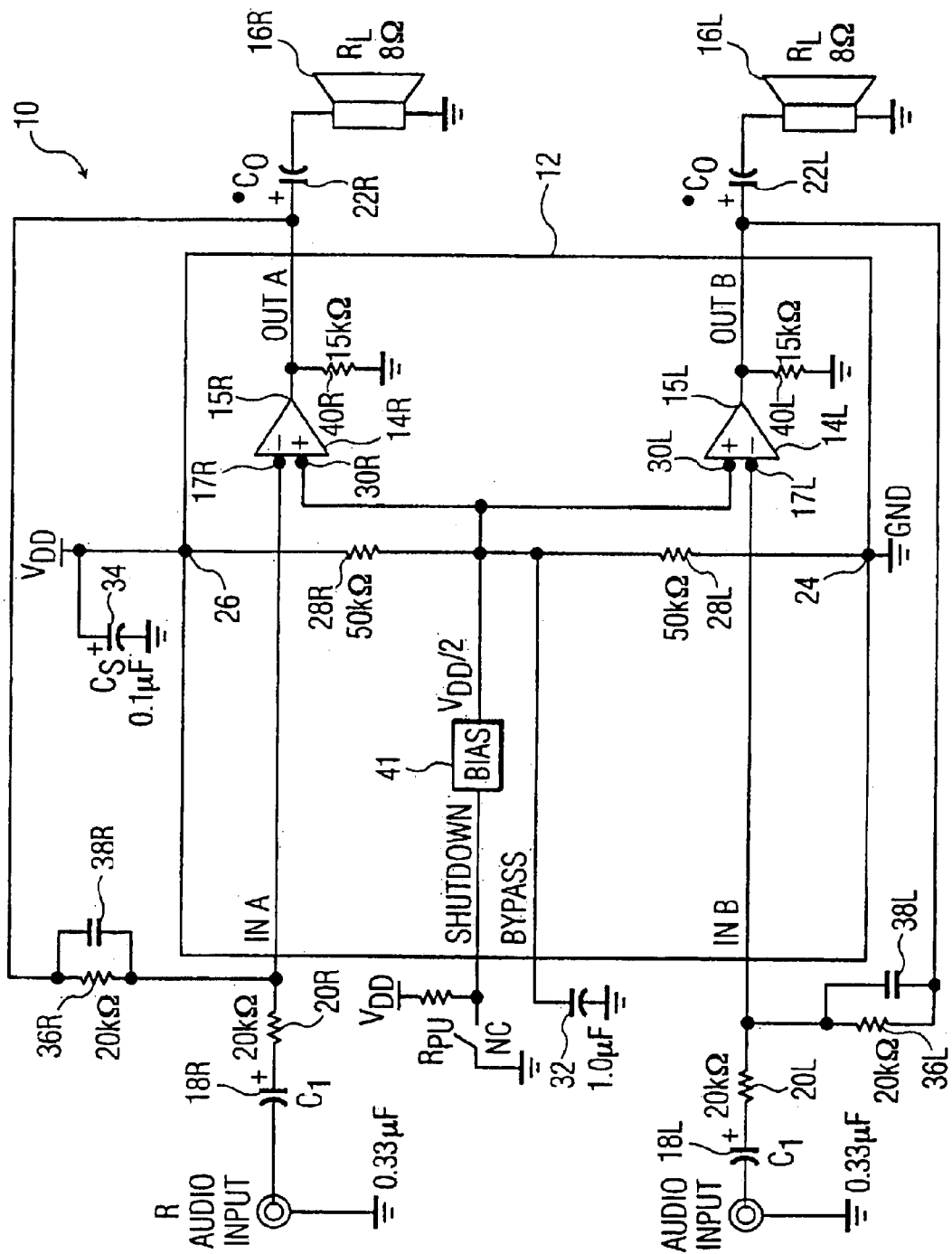
FIG. 1 is a partial schematic,-partial block diagram of a prior art circuit.

FIG. 1 is a prior art partial schematic,-partial block diagram of an applications circuit for an LM4881 integrated circuit, as recommended by the manufacturer of the integrated circuit, © 1997 National Semiconductor Corporation USA., and appropriately modified to comply with patent application requirements. Referring to FIG. 1, an amplifier system, generally designated 10, includes an integrated circuit chip 12, which, in the exemplary embodiment, provides a pair of operational amplifiers 14R, 14L for respective L and R stereophonic amplification and sound reproduction. Signals R and L are coupled to inverting inputs 17R, 17L of respective amplifiers 14R, 14L through respective coupling capacitors 18R, 18L and is isolation resistors 20R, 20L. Output signals of amplifiers 14R, 14L at terminals 15R, 15L, drive respective loudspeakers 16R, 16L through coupling capacitors 22R, 22L. Loudspeakers 16R, 16L in the present case are earphone speakers.

Power for this arrangement is provided by a single ended power supply (not shown), with one side grounded at node 24, and positive voltage $V_{DD}$ provided at node 26. Resistors 28R, 28L form a divider for providing a virtual AC reference signal ground at their junction for non-inverting terminals 30R, 30L through coupling capacitor 32. Power supply decoupling capacitor 33 prevents high frequency common mode feedback through the power supply. Resistors 36R, 36L in parallel with respective high frequency roll-off capacitors 38R, 38L, from respective output terminals 15R, 15L, to inverting terminals 17R, 17L and isolation resistors 20r, 20L, provide negative signal feedback and prevent oscillation with a high frequency roll-off. Resistors 40R, 40L provide a DC return for leakage currents thus improving DC stability. Shut-down circuit 41 is internal to integrated circuit 12.

Particular note should be made of DC blocking, coupling capacitors 18R, 18L, 22R, 22L as well as AC ground coupling capacitor 32. By the voltage translation disclosed in connection with FIG. 2 of the circuit of FIG. 1, so that the circuit is powered by a split voltage power supply with a center tapped ground, these five coupling capacitors are eliminated, as will be discussed below.

Figure 2:
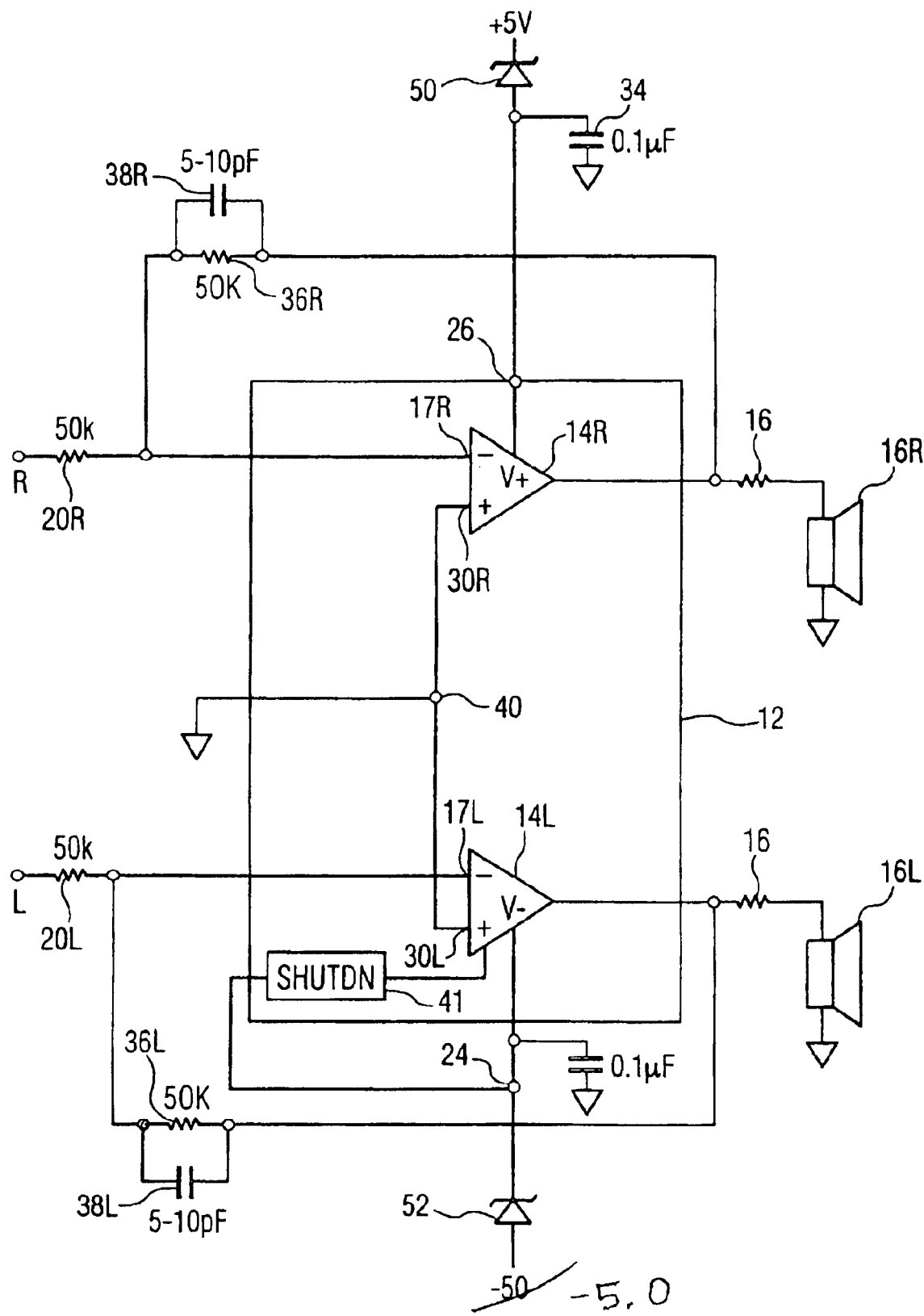
FIG. 2 is a schematic of the amplifier of FIG. 1 incorporating the two translation circuits according to aspects of the present invention.

The single-ended power supply used for FIG. 1 (not shown) and the split voltage power supply with a center tapped ground (not shown) used for FIG. 2, are both well known power supply configurations which can be found, inter alia, in the Motorola™ Silicon Rectifier Handbook, © 1966, at pages 4–10 and 6–4 respectively. The single ended power supply can be a full wave or full wave bridge power supply with a single DC polarity to ground. The "split voltage power supply" is commonly referred to as a full wave bridge doubler, generating opposite DC polarities with respect to an AC input lead which serves as ground. The ground serves as a center tapped AC ground return at the junction of series power supply capacitors, as well as a DC ground for the plus and minus DC power supply voltages.

The device into which the described headphone amplifier is to be installed, is a DVD player. One of the "incompatibility" problems is that the configuration of the DVD power supply is a "split voltage power supply" which is not compatible with the integrated circuit, which was designed for a single ended power supply, as discussed in FIG. 1. The second of the "incompatibility" problems is that once the configuration incompatibility problem is overcome, the power supply voltages of the second power supply exceeded the maximum voltage specifications for the chosen integrated circuit. Both problems of "incompatibility" are overcome by the voltage translation circuits shown in FIG. 2, and discussed and claimed below, wherein like members to the members of FIG. 1 are given like numeral designations.

Referring now to FIG. 2, the circuit of FIG. 1 is voltage translated to be used with a split voltage power supply having plus and minus voltages available with a center tapped ground, wherein node 26 is connected to the plus voltage supply, node 24 is connected to the negative voltage supply and ground node 40 is connected to the center tapped ground. In this way, the voltages of the integrated circuit are translated negative by one half the total voltage of the single ended supply of FIG. 1.

Since the ground terminal is now an actual ground voltage of the split level power supply instead of a virtual ground for the single ended power supply as provided by divider resistors 28R, 28L and capacitor 32, the DC blocking capacitors 18R, 18L, 22R and 22L are no longer required because the AC ground is at the power supply voltage of DC ground. Since the AC and DC grounds are now at the same DC voltage, capacitor 32 also becomes unnecessary.

Having solved the configuration "incompatibility" problem and saved five coupling capacitors by voltage translation, this leaves the voltage level "incompatibility" problem. The present invention also discloses a system comprising a level translator circuit having level translators provided by a zener diode conducting in the zener region, with each zener diode reducing the voltage level on one side of the split level power supply applied to integrated circuit 12. The translation of voltages from a first voltage level to a second voltage level is provided by generating a zener voltage and applying the zener voltage as a voltage drop between the power supply terminals and the operational amplifier nodes 24, 26.

In the present instance, the split level power supply voltages are ±5.0 volts but the particular integrated circuit is specified for 5.5 volts maximum. This 10 volt supply exceeds the maximum voltage rating of the integrated circuit since it is possible that adjacent parts of the integrated circuit may have a 10 volt differential between them, e.g., if the integrated circuit chip substrate is internally connected to one of the power supply voltages and not to ground.

This possible over-voltage condition is solved by adding two 2.4 volt zener diodes 50, 52 poled in their zener polarity, each added in series with one side of the split power supply voltages. The two zener diodes thus provide a 2×2.4=4.8 volt drop to bring the maximum power supply voltage to volts across the integrated circuit 12. Thus, each of the split voltage power supply sides of ±5.0 volts are translated downward to ±2.6 volts. Zener diodes 50, 52 are selected to be in the zener region of their characteristic at the DC current drawn by the amplifiers 14R, 14L. In the alternative, non-zener silicon diodes, poled in the forward conducting direction, can also be used (not shown), e.g. four diodes each having a 0.6 voltage drop, would provide a 2.4 volts drop instead of a zener diode. The value of the zener voltages or the number of forward biased silicon diodes can be chosen according to the level of voltage drop desired. However, using zener diodes, provides better power supply regulation.

The present embodiment(s) shows the operational amplifiers 14R, 14L in an inverting amplifier configuration where the gain $A_v=R_f/R_i$ where $R_f$ is the negative feedback resistor and $R_i$ is the input impedance at terminal 17R, 17L. The present embodiments also apply with the operational amplifiers 14R, 14L connected in a non-inverting amplifier configuration (not shown), i.e., the feedback resistors are returned to the non-inverting terminals 30R, 30L with a gain $A_v=1+(R_f R_i)$ and the inverting terminals 17R, 17L are coupled to ground.

The present embodiment(s) show a voltage translation from an over-voltage power supply which is a split level power supply. It is within the contemplation of the present invention that a single ended over-voltage power supply can be used in which case only a single zener diode need be used.

What is claimed is:

1. A voltage level translator for operating an operational amplifier integrated circuit designed for operation with a single ended power supply, to operate with a split level power supply having a center tapped ground, comprising:

first voltage level translating means for connecting a first polarity power supply terminal of the operational amplifier integrated circuit and a first capacitor coupled to ground to a first polarity of the power supply, second voltage level translating means for connecting a second polarity power supply terminal of the operational amplifier integrated circuit and a second capacitor coupled to ground to a second polarity of the split level power supply, means for connecting a signal input terminal of the operational amplifier to a center tapped ground of the split level power supply and:

wherein another signal input terminal of the operational amplifier is coupled to a signal source referenced to ground without any DC isolation capacitors connected in series with the amplifier and the output terminal of the operational amplifier is coupled to a signal load referenced to ground without any DC isolation capacitors connected in series with the amplifier, and wherein said operational amplifier has a predetermined maximum voltage rating and said split level power supply having a voltage greater than said maximum voltage rating, and said first voltage level translating means and said second voltage level translation means each comprise a respective Zener diode having respective Zener voltages selected to enable said integrated circuit to operate within said maximum voltage rating when powered by said split level power supply.

2. The voltage level translator of claim 1 wherein the signal load is a loudspeaker having one terminal referenced to ground.

3. The voltage level translator of claim 1 wherein the amplifier includes a plurality of amplifiers on the same integrated circuit chip having a common substrate, and all of the plurality of amplifiers are also voltage level translated, the substrate being biased the same amount with respect to each of the plurality of amplifiers.

4. The voltage level translator of claim 1 wherein the split level power supply having a center tapped ground also provides power to other circuits performing other functions.

5. The voltage level translator of claim 4, wherein the amplifier includes an output load comprising an earphone and the other circuits performing other functions is a DVD player.

6. The voltage level translator of claim 1 wherein the amplifier has an AC reference which is connected to the DC voltage ground.

7. A voltage level translator for operating an operational integrated circuit designed for operation with a single ended power supply, to operate with a split level power supply having a center tapped ground, comprising:

a first voltage level translating means for connecting a first polarity power supply terminal of the operational amplifier integrated circuit and a first capacitor coupled to ground to a first polarity of the split level power supply;

a second voltage level translating means for connecting a second polarity power supply terminal of the operational amplifier integrated circuit and a second capacitor coupled to ground to a second polarity of the split level power supply;

said operational amplifier has a predetermined maximum voltage rating and said split level power supply having a voltage greater than said maximum voltage rating; and said first voltage level translating means and said second voltage level translation means each comprise a respective Zener diode having respective Zener voltages selected to enable said integrated circuit to operate within said maximum voltage rating when powered by said split level power supply.

* * * * *